United States Patent [19]

Ueno et al.

[11] Patent Number: 4,603,057
[45] Date of Patent: Jul. 29, 1986

[54] METHOD FOR THE PREPARATION OF A POLYVINYL CHLORIDE RESIN SHAPED ARTICLE WITH METALLIZED SURFACE

[75] Inventors: Susumu Ueno; Hirokazu Nomura, both of Ibaraki, Japan

[73] Assignee: Shin-Etsu Chemical Co., Ltd., Tokyo, Japan

[21] Appl. No.: 690,379

[22] Filed: Jan. 10, 1985

Related U.S. Application Data

[63] Continuation of Ser. No. 554,837, Nov. 23, 1983, abandoned.

[30] Foreign Application Priority Data

Nov. 25, 1982 [JP] Japan .................. 57-206784

[51] Int. Cl.⁴ .............................. B05D 3/06
[52] U.S. Cl. ...................... 427/40; 427/39; 427/41; 427/132; 427/250; 427/255; 427/404; 427/412.1; 427/419.1; 427/419.2
[58] Field of Search ............ 427/39, 40, 41, 412.1, 427/404, 419.1, 419.2, 132, 250, 255

[56] References Cited

U.S. PATENT DOCUMENTS

| | | | |
|---|---|---|---|
| 4,396,641 | 8/1983 | Imada et al. | 427/41 |
| 4,429,024 | 1/1984 | Ueno | 427/41 |
| 4,496,626 | 1/1985 | Kasuga | 427/132 |
| 4,520,070 | 5/1985 | Yamamoto | 427/132 |
| 4,521,482 | 6/1985 | Arai | 427/132 |

Primary Examiner—Richard Bueker
Attorney, Agent, or Firm—Toren, McGeady, Stanger, Goldberg & Kiel

[57] ABSTRACT

The invention provides a method for the preparation of a shaped article of a flexible or semi-rigid polyvinyl chloride resin having a metallized surface, of which the adhesive bonding of the metallizing layer to the substrate surface is greatly improved. In the inventive method, the surface of the shaped article is first exposed to low temperature plasma generated in an atmosphere containing a vapor of a specified organosilicon compound before the metallizing treatment in a dry process such as vacuum vapor deposition, ion plating and the like.

5 Claims, No Drawings

METHOD FOR THE PREPARATION OF A POLYVINYL CHLORIDE RESIN SHAPED ARTICLE WITH METALLIZED SURFACE

This is a continuation of application Ser. No. 554,837, filed Nov. 23, 1983, now abandoned.

BACKGROUND OF THE INVENTION

The present invention relates to a method for the preparation of a shaped article of a polyvinyl chloride resin with metallized surface. More particularly, the invention relates to a method for the preparation of a shaped article of a flexible or semi-rigid polyvinyl chloride resin with metallized surface, of which the metallizing layer on the surface has remarkably improved adhesion to the surface of the shaped article as the substrate.

Needless to say, the techniques of metallizing, i.e. the techniques for providing a coating layer of, typically, a metal on the surface of a substrate body, e.g. various shaped articles of synthetic resins, are widely undertaken when electroconductivity, antistatic effect, decorative metallic luster, reflectivity or shielding of light and the like properties are desired on the surface of the synthetic resin shaped articles. Sometimes it is also desired that the synthetic resin shaped articles with metallized surface have flexibility at least to some extent as in the application of the article as a wrapping material and the like. A widely practiced way in such a case is to shape the article as the substrate for metallizing of a flexible or semi-rigid polyvinyl chloride resin from the standpoint of the outstanding inexpensiveness and excellent workability, especially, after metallizing as well as the freely controllable flexibility of the resins in comparison with other kinds of synthetic resins.

Unfortunately, however, shaped articles of a flexible or semi-rigid polyvinyl chloride resin with metallized surface are not free from the most serious problems or defects described below. In the first place, the adhesive bonding strength between the metallizing surface layer and the surface of the shaped article as the substrate is relatively low so that the metallizing layer is readily peeled off from the substrate surface even by gentle rubbing. This disadvantage is due not only to the inherently low affinity between the metallizing layer and the polyvinyl chloride resin but also to the bleeding of the plasticizer or other additives always formulated in the flexible or semi-rigid polyvinyl chloride resins on to the surface of the shaped article badly affecting the adhesion as a matter of course. In the second place, the chemical stability and mechanical strengths of the metallizing layer per se are relatively low on the surface of the flexible or semi-rigid polyvinyl chloride resin in comparison with the metallizing layers on other types of synthetic resins. This problem is presumably due to the fact that, assuming that the metallizing is performed by the technique of vacuum vapor deposition, the deposition of the molecules or ions in the metal vapor on to the substrate surface proceeds necessarily in the presence of the plasticizer or other low molecular-weight additives in the atmosphere evaporated from the shaped article due to the vapor pressure thereof not negligibly low so that the metallizing layer is always contaminated by the concurrent deposition of the vapor of these additives with the metal vapor leading to the unavoidable decrease in the chemical stability and mechanical strengths of the metallizing layer. These problems are characteristic in the flexible and semi-rigid polyvinyl chloride resins and out of the question in most of other synthetic resins including rigid polyvinyl chloride resins.

It may be the most easy idea in order to improve the adhesive bonding strength between a substrate surface and a coating layer thereon that the surface is treated in advance with a primer before providing the coating layer. This method of surface priming with certain primers such as a specific organosilane compound is indeed effective to some extent when the synthetic resin of which the article to be metallized is shaped is a polyimide resin or a polyethylene terephthalate resin. Further, several other methods have been proposed for the purpose including the chemical treatment of the substrate surface with a reactive chemical or a solvent, flame treatment, treatment by corona discharge, treatment by sputtering-etching and the like.

These methods hitherto proposed and considerably effective for other synthetic resins are, however, little or not effective when the shaped article is made of a flexible or semi-rigid polyvinyl chloride resin. For example, the adhesion of the above mentioned organosilane compound as a primer to the surface of the flexible or semi-rigid polyvinyl chloride resin is extremely weak so that substantially no improvement can be expected by the priming treatment in the adhesive bonding strength between the metallizing layer and the substrate surface even by setting aside the problems that the adhesion between the primer layer and the metallizing layer is also not sufficiently good and the mechanical strengths of the primer layer per se is also poor.

SUMMARY OF THE INVENTION

It is therefore an object of the present invention to provide a shaped article of a flexible or semi-rigid polyvinyl chloride resin with metallized surface of which the adhesive bonding strength between the metallizing layer and the surface of the shaped article is remarkably improved and the metallizing layer has greatly improved chemical stability and mechanical strength.

Thus, the method of the present invention established as a result of the extensive investigations undertaken by the inventors with the above mentioned object comprises: (a) subjecting the surface of a shaped article of a flexible or semi-rigid polyvinyl chloride resin to exposure to low temperature plasma generated in an atmosphere containing a vapor of an organosilicon compound under a pressure in the range from 0.001 to 10 Torr to deposit a polymerized layer of the organosilicon compound on the surface, and (b) metallizing the shaped article thus coated with the polymerized layer of the organosilicon compound.

In particular, the organosilicon compound is preferably an organosilane compound represented by the general formula $R_aH_bSiX_{4-a-b}$, in which R is a substituted or unsubstituted monovalent hydrocarbon group, X is a halogen atom or an alkoxy group, the suffix a is a number of zero, 1, 2 or 3 and the suffix b is a number of zero or 1 with the proviso that a+b does not exceed 3, or a partial hydrolysis-condensation product thereof.

It has been also discovered that further improved results can be obtained when the above described low temperature plasma treatment in an atmosphere of an organosilicon compound is preceded by a low temperature plasma treatment in an atmosphere of an inorganic gas.

DETAILED DESCRIPTION OF THE PREFERRED EMBODIMENTS

First of all, the definiton of the term "metallizing" in the present invention is given. It should be noted that the definition of the term "metallizing" here implied is not limited to the process of providing a coating layer of a metal on a substrate surface according to a usual definition but also includes the process of providing a coating layer of any inorganic materials such as indium oxide $In_2O_3$, magnesium fluoride $MgF_2$ and the like metal compounds by a technique excepting the wet-process metal plating such as vacuum vapor deposition, ion plating, sputtering and other dry processes.

The substrate body of the shaped article with metallized surface prepared according to the inventive method is made of a flexible or semi-rigid polyvinyl chloride resin which is a resinous composition obtained by at least partly plasticizing a polyvinyl chloride resin with admixture of a plasticizer. The polyvinyl chloride resin is not limited to the so-called homopolymers of vinyl chloride but any copolymeric resins are included in the invention provided that the main part or, for example, 50% by weight or more of the monomeric constituent thereof is vinyl chloride. The comonomers to be copolymerized with vinyl chloride to form the above mentioned copolymeric resins are exemplified by vinyl esters, e.g. vinyl acetate, vinyl ethers, acrylic and methacrylic acids and esters thereof, maleic and fumaric acids and esters thereof as well as maleic anhydride, aromatic vinyl compound, e.g. styrene, vinylidene halides, e.g. vinylidene chloride, (meth)acrylonitrile and olefins, e.g. ethylene and propylene.

According to the definition of the flexible or semi-rigid polyvinyl chloride resin, the polyvinyl chloride resin must be at least partly plasticized by the admixture of a plasticizer. Suitable plasticizers are well known in the art of polyvinyl chloride processing and exemplified by phthalic acid esters such as dioctyl or di(2-ethylhexyl) phthalate, dibutyl phthalate and butyl benzyl phthalate, esters of aliphatic dibasic acids such as dioctyl adipate and dibutyl sebacate, esters of pentaerithritol, esters of glycols such as diethyleneglycol dibenzoate, fatty acid esters such as methyl acetylricinolate, phosphoric acid esters such as tricresyl phosphate and triphenyl phosphate, epoxidated vegetable oils such as epoxidated soybean oil and epoxydated linseed oil, citric acid esters such as acetyl tributyl citrate and acetyl trioctyl citrate, polyesteric compounds such as trialkyl trimellitates, tetra-n-octyl pyromellitate and polypropylene adipate, and others.

It is of course optional that, in addition to the above named plasticizers, the polyvinyl chloride resin is admixed with conventional additives used in the processing of polyvinyl chloride resins including lubricants and stabilizers such as metal salts of carboxylic acids or, in particular, stearic acid, e.g. calcium stearate, zinc stearate, lead stearate, barium stearate and cadmium stearate, lead compounds, e.g. tribasic lead sulfate and dibasic lead phosphite, organic tin compounds, e.g. dibutyltin dilaurate, di-n-octyltin maleate and di-n-octyltin mercaptide, higher fatty acids and esters thereof such as butyl stearate, higher fatty acid amides such as ethylene bisstearoamide, polyethylene waxes and others as well as other additives conventionally used in shaping of polyvinyl chloride resins such as fillers, heat resistance improvers, antioxidahts, ultraviolet absorbers, antistatic agents, antifogging agents, pigments, dyes, crosslinking aids and the like.

Furthermore, the polyvinyl chloride resin may be admixed with certain rubbery polymers such as copolymers of ethylene nd vinyl acetate, copolymers of acrylonitrile and butadiene, copolymers of styrene and acrylonitrile, copolymers of methyl methacrylate, styrene and butadiene, copolymers of acrylonitrile, styrene and butadiene, polyurethane elastomers, polyamide resins, terpolymers of ethylene, propylene and a dienic monomer, epoxy-modified polybutadiene resins and the like provided that the amount thereof is not excessively large or, for example, not exceeding 50 parts by weight per 100 parts by weight of the polyvinyl chloride resin.

The method for molding the polyvinyl chloride resin composition into a shaped article is not particularly limited but any conventional molding techniques can be undertaken including extrusion molding, injection molding, calendering, inflation and compression molding. The kinds and configurations of the shaped articles are also not limitative provided that uniformity of the effect of low temperature plasma treatment can be ensured throughout the whole surface to be metallized.

The step (a) of the inventive method is the low temperature plasma treatment of the shaped article of the above defined flexible or semi-rigid polyvinyl chloride resin with the plasma generated in an atmosphere containing a gaseous organosilicon compound to deposit a plasma-polymerized layer of the organosilicon compound on the surface. The organosilicon compound used here is not limited to those in a gaseous form at room temperature but any compounds can be used provided that the compound can be gasified including various kinds of organosilane compounds and organopolysiloxanes having a relatively low molecular weight. Preferable organosilicon compounds, however, are the organosilane compounds represented by the general formula $R_aH_bSiX_{4-a-b}$, in which R is a substituted or unsubstituted monovalent hydrocarbon group, X is a halogen atom or an alkoxy group, the suffix a is a number of zero, 1, 2 or 3 and the suffix b is a number of zero or 1 with the proviso that $a+b$ does not exceed 3, and organopolysiloxanes as a partial hydrolysis-condensation product of such an organosilane compound.

In the above given general formula, the substituted or unsubstituted monovalent hydrocarbon group denoted by the symbol R is exemplified by alkyl groups such as methyl, ethyl, propyl and butyl groups, alkenyl groups such as vinyl and allyl groups, alkynyl groups such as ethynyl, propynyl and butynyl groups and aryl groups such as phenyl and naphthyl groups as well as those substituted groups obtained by the substitution of halogen, e.g. chlorine, atoms, cyano groups or other substituents for part or all of the hydrogen atoms in the above named hydrocarbon groups. The group denoted by the symbol X in the general formula is exemplified by chlorine, bromine and other halogen atoms and methoxy, ethoxy, butoxy and other alkoxy groups.

Several of the organosilane compounds in conformity with the above definition of the general formula include: methyl dichlorosilane, dimethyl chlorosilane, dimethyl methoxysilane and methyl chloromethyl methoxy chlorosilane as the examples of those expressed by the formula $RHSiX_2$ or $R_2HSiX$; trimethyl chlorosilane, trimethyl methoxysilane, trimethyl ethoxysilane, vinyl dimethyl chlorosilane, vinyl dimethyl methoxysilane, vinyl dimethyl ethoxysilane, ethynyl dimethyl methoxysilane, ethynyl dimethyl chlorosilane, triethyl methoxysilane, dimethyl chloromethyl ethoxysilane, dimethyl chloromethyl chlorosilane, dimethyl phenyl methoxysilane, 2-chloroethyl dimethyl chlorosilane and 2-chloroethyl dimethyl methoxysilane as the examples of those expressed by the formula $R_3SiX$; dimethyl dichlorosilane, dimethyl dimethoxysilane, diethyl dimethoxysilane, dimethyl diethoxy silane, vinyl methyl dichlorosilane, vinyl methyl dimethoxysilane, 2-chloroethyl methyl dimethoxysilane, vinyl methyl diethoxysilane, chloromethyl methyl dichlorosilane, methyl phenyl dimethoxysilane and chloromethyl methyl dimethoxysilane as the examples of those expressed by the formula $R_2SiX_2$; methyl trimethoxysilane, methyl triethoxysilane, vinyl trichlorosilane, vinyl trimethoxysilane, vinyl triethoxysilane, phenyl trimethoxysilane, chloromethyl trimethoxysilane and 2-chloroethyl trimethoxysilane as the examples of those expressed by the formula $RSiX_3$; and tetramethoxysilane and tetraethoxysilane as the examples of those expressed by the formula $SiX_4$. Although the above given examples are limited to those in which X is a chlorine atom or an alkoxy group, it is of course that X can be an atom of bromine or other halogens. These organosilicon compounds may be used either singly or as a mixture of two kinds or more according to need whereby certain synergistic effects can be expected in some cases.

In addition, several other organosilane compounds conventionally used as a silane coupling agent may be used in place of the above named organosilane compounds including vinyl tris(2-methoxyethoxy)silane, 3-glycidyloxypropyl trimethoxysilane, 3-methacryloxypropyl trimethoxysilane, N-(2-aminoethyl)-3-aminopropyl trimethoxysilane, N-(2-aminoethyl)-3-aminopropyl methyl dimethoxysilane, 3-chloropropyl trimethoxysilane, 3-mercaptopropyl trimethoxysilane, 3-aminopropyl triethoxysilane and the like.

The above named organosilane compounds can be converted into an organopolysiloxane compound by partial hydrolysis and condensation and such an organopolysiloxane compound can be used as the organosilicon compound in the atmosphere of low temperature plasma provided that the compound has a vapor pressure sufficient to support the plasma discharge across the atmosphere. Several examples of such organopolysiloxane compounds include 1,3-divinyl-1,1,3,3-tetramethyl disiloxane, 1,3-di(chloromethyl)-1,1,3,3-tetramethyl disiloxane, 1,3-diethynyl-1,1,3,3-tetramethyl disiloxane, 1,1,3,3-tetramethyl disiloxane and the like.

The low temperature plasma treatment in the step (a) of the inventive method is performed by generating low temperature plasma with supply of an electric power to the electrodes of the plasma chamber containing the shaped article to be treated therein while the pressure inside the plasma chamber is kept at 10 Torr or below under continuous flow of the gaseous organosilicon compound therethrough. It is optional that the gas or vapor of the organosilicon compound is diluted with an inorganic gas such as an inert gas, e.g. helium and argon, nitrogen, oxygen, air, hydrogen, water vapor, carbon dioxide and carbon monoxide or an organic gas other than organosilicon compounds.

In the above mentioned low temperature plasma treatment, the pressure of the gaseous organosilicon compound should be 10 Torr or below since no good adhesion can be obtained between the surface of the shaped article and the metallizing layer thereon when the pressure exceeds 10 Torr. The pressure should be in the range from 0.001 to 10 Torr or, preferably, from 0.005 to 1 Torr.

When the atmospheric conditions are kept as described above in the plasma chamber, low temperature plasma can readily be generated in the plasma chamber by supplying an electric power of, for example, several watts to several hundreds of kilowatts at a frequency of several kHz to several hundreds of MHz to the electrodes of the plasma chamber. Although the electrodes are preferably installed within the plasma chamber, they may be installed outside the plasma chamber or may be replaced with a single high-frequency work coil surrounding the plasma chamber. The type of the electric discharge may be either glow discharge or corona discharge. The length of time for the low temperature plasma treatment should be determined depending on various factors such as the power input, thickness of the desired plasma-polymerized layer of the organosilicon compound and others but it is usually in the range from a few seconds to several tens of minutes to give quite satisfactory results. Sufficient effects can be obtained with a thickness of the plasma-polymerized layer of the organosilicon compound of at least about 5 nm (nanometers).

It is sometimes preferable that the above described treatment of the shaped article by the exposure to a low temperature plasma in an atmosphere containing the organosilicon compound is preceded by a similar low temperature plasma treatment in an atmosphere of an inorganic gas in the absence of the organosilicon compound so that the adhesive bonding of the metallizing layer to the substrate surface can be further improved and longer durability of the metallizing layer can be obtained. The inorganic gas suitable for such a purpose is exemplified by helium, neon, argon, nitrogen, oxygen, air, nitrous oxide, nitrogen monoxide, nitric oxide, carbon monoxide, carbon dioxide, bromine cyanide, sulfur dioxide, hydrogen sulfide and the like. These inorganic gases may be used either singly or as a mixture of two kinds or more according to need. The atmospheric and electric conditions for this preliminary plasma treatment may be about the same as in the low temperature plasma treatment in an atmosphere containing the organosilicon compound including the pressure of the atmosphere, electric power and frequency, length of treatment time and others.

The step (b) to follow the low temperature plasma treatment of the shaped article in the above described manner is the metallizing of the shaped article to give the desired product. The metallizing can be performed according to a conventional procedure without particular limitations. The methods of vacuum vapor deposition, ion plating and sputtering are suitable for the purpose of metallizing. For example, metallizing by vacuum vapor deposition can be performed by vaporizing a desired metallizing material such as aluminum, zinc, chromium, indium oxide $In_2O_3$, magnesium fluoride $MgF_2$ and the like under heating by direct resistance heating, heating by radiation, high-frequency induction heating and the like suitable heating means in a vacuum atmosphere of $10^{-4}$ to $10^{-5}$ Torr to deposit the metallizing layer at a rate of 1 to 100 μm of the thickness per minute. The conditions for metallizing by other methods such as reactive vapor deposition, ion plating, sputtering and the like are also much the same as in the conventional procedures. The thus obtained metallizing layer exhibits unexpectedly improved adhesive bonding strength to the substrate surface of the shaped article after the step (a) as well as high mechanical strengths and chemical stability.

Following are the examples to illustrate the method of the invention in further detail.

EXAMPLE 1

A resin composition composed of 100 parts by weight of a polyvinyl chloride resin and 60 parts by weight of di(2-ethylhexyl) phthalate (DOP) was shaped into a sheet of a flexible polyvinyl chloride resin. The sheet was placed in a plasma chamber of a plasma-generating apparatus which was evacuated to a vacuum of $10^{-3}$ Torr and controlled and maintained at a pressure of 0.1 Torr by the balance of a continuous introduction of air and evacuation. At this state, vapor of trimethyl chlorosilane was introduced into the plasma chamber at a constant rate to be admixed with the air flowing through the chamber so that the partial pressures of the air and the silane vapor in the chamber were 0.1 Torr and 0.3 Torr, respectively. While the atmospheric conditions in the plasma chamber were kept as described above, a high frequency electric power of 1 kilowatt at a frequency of 13.56 MHz was supplied to the electrodes for 300 seconds so that low temperature plasma was generated inside the plasma chamber and the surface of the resin sheet became covered with a layer of the plasma-polymerized organosilane compound. The thickness of this plasma-polymerized layer was about 100 nm.

The thus plasma-treated resin sheet was placed in an apparatus for vacuum vapor deposition and metallized with aluminum vaporized in a vacuum of $1 \times 10^{-4}$ Torr by induction heating of 10 kilowatts power. The thickness of the thus formed metallizing layer of aluminum was about 200 nm.

The test for the adhesive bonding strength of the metallizing layer to the substrate surface was performed by the tape-peel test in which a commercially available adhesive tape was applied with pressure on to the surface of the metallizing layer followed by peeling of the tape at a velocity of 1 cm/second to visually examine the proportion of the area from which the metallizing layer of aluminum had been removed with the tape. In this case, no peeling of the metallizing layer took place at all indicating remarkably high resistance of the layer against peeling with improved adhesive bonding strength to the substrate surface.

For comparison, the same experimental procedure as above was repeated excepting the omission of the low temperature plasma treatment in the atmosphere containing the organosilane compound. The tape-peel test of the metallized surface indicated that the metallizing layer was completely removed with the tape on the area having been bonded to the adhesive tape.

EXAMPLE 2

A sheet of flexible polyvinyl chloride resin was prepared of a resin composition composed of 100 parts by weight of a polyvinyl chloride resin and 40 parts by weight of di(2-ethylhexyl) adipate (DOA). The resin sheet was placed in the plasma chamber into which, after evacuation to a pressure of $10^{-4}$ Torr, argon gas was continuously introduced with simultaneous evacuation to keep the pressure inside the chamber at 0.05 Torr. A high frequency electric power of 5 kilowatts at a frequency of 110 kHz was supplied to the electrodes for 180 seconds under the above mentioned atmospheric condition to expose the surface of the resin sheet to the plasma atmosphere.

In the next place, the introduction of argon gas into the plasma chamber was interrupted and, after second evacuation of the chamber to a vacuum of $10^{-4}$ Torr, vapor of 3-chloropropyl dimethoxy chlorosilane was continuously introduced into the chamber to keep the pressure inside the chamber at 0.3 Torr by the balance with continuous evacuation. Low temperature plasma was generated under this atmospheric condition in the same electric conditions as above for 300 seconds to deposit a plasma-polymerized layer of the silane compound on the surface of the resin sheet. The thickness of the thus formed plasma-polymerized layer of the silane compound was about 50 nm. Metallizing of the above obtained plasma-treated resin sheet was performed in the same manneer as in Example 1 to give a metallizing layer of alumihum having a thickness of about 200 nm.

The same tape-peel test as in Example 1 was undertaken with the above prepared metallized resin sheet and two more sheets, one of which had been metallized directly following the low temperature plasma treatment in the argon atmosphere with omission of the deposition of the plasma-polymerized layer of the silane compound and the other of which had been metallized with omission of the plasma treatments in two steps at all, the conditions for the plasma treatment in the argon atmosphere and the metallizing being the same as above. The results of the tape-peel tests were that no peeling of the metallizing layer took place at all from the metallized resin sheet prepared by the two-step plasma treatments in the argon atmosphere and the silane-containing atmosphere while about four fifths of the taped area of the metallizing layer were peeled off from the metallized resin sheet prepared with omission of the plasma treatment in the silane-containing atmosphere and the metallizing layer on the taped area was completely removed with the tape from the metallized resin sheet prepared with omission of both steps of the plasma treatments.

EXAMPLE 3

A sheet of flexible polyvinyl chloride resin was prepared of a resin composition composed of 100 parts by weight of a polyvinyl chloride resin, 20 parts by weight of di(2ethylhexyl) phthalate and 20 parts by weight of diisoheptyl phthalate (DHP). The resin sheet was placed in the plasma chamber and, after evacuation of the chamber to a vacuum of $10^{-3}$ Torr, carbon monoxide gas was continuously introduced into the chamber to keep the pressure inside the chamber at 0.5 Torr by the balance with continuous evacuation. Low temperature plasma was generated in the plasma chamber under the above atmospheric condition by supplying a high frequency electric power of 500 watts at a frequency of 13.56 MHz for 180 seconds to expose the surface of the resin sheet to the plasma atmosphere.

In the next place, introduction of carbon monoxide gas was interrupted and, after evacuation of the plasma chamber to a pressure of $10^{-3}$ Torr, vapor of vinyl dimethyl chlorosilane was continuously introduced thereinto to give and maintain a pressure of 0.1 Torr inside the chamber. A second low-temperature plasma treatment was performed for 300 seconds under this atmospheric condition and under the same electric conditions as in the first plasma treatment to deposit a plasma-polymerized layer of the silane compound having a thickness of about 50 nm on the surface.

The resin sheet thus provided with the plasma-polymerized layer on the surface was placed in an apparatus for coating by sputtering and sputtering of aluminum was performed by generating argon gas plasma in an atmosphere under a pressure of $10^{-2}$ Torr with supply of 500 watts of electric power. The thus formed layer of aluminum had a thickness of about 50 nm.

For comparison, two more resin sheets with a metallizing layer by aluminum sputtering were prepared in the same procedure as above except that the second low-temperature plasma treatment in the atmosphere of silane vapor was omitted for one of them or the low-temperature plasma treatment in two steps was omitted at all to directly provide the aluminum metallizing layer on the resin sheet for the other.

The tape-peel test was undertaken with these three resin sheets in the same manner as in Example 1 to give results that no peeling of the aluminum metallizing layer took place at all on the resin sheet provided with the metallizing layer after the two-step plasma treatments in a carbon monoxide atmosphere and the silane vapor atmosphere while the aluminum metallizing layer became peeled off on about three fifths of the taped area on the resin sheet prepared with omission of the plasma treatment in the silane vapor atmosphere before the sputtering with aluminum and the aluminum metallizing layer was completely removed with the adhesive tape from the taped area on the surface of the resin sheet provided with the metallizing layer without the plasma treatments at all.

EXAMPLE 4

A semi-rigid resin film shaped of a composition composed of 100 parts by weight of a polyvinyl chloride resin and 10 parts by weight of di(2-ethylhexyl) phthalate was placed in the plasma chamber into which argon gas was continuously introduced after evacuation to a pressure of $10^{-4}$ Torr to keep the pressure inside the chamber at 0.07 Torr. Then, vapor of trimethyl chlorosilane was introduced into the chamber so that the partial pressures of the argon gas and the silane vapor were 0.07 Torr and 0.23 Torr, respectively, by the balance of the continuous introduction of these gases or vapors and continuous evacuation. Under the above described atmospheric conditions, low temperature plasma was generated inside the chamber by supplying a high frequency electric power of 3 kilowatts at a frequency of 110 kHz for 360 seconds to deposit a plasma-polymerized layer of the silane compound having a thickness of about 100 nm on the surface of the film. The resin film thus provided with the plasma-polymerized layer of the silane compound was further coated with aluminum by sputtering in the same manner as in Example 3. The thickness of this aluminum metallizing layer was about 50 nm.

For comparison, another resin film with aluminum metallizing by sputtering was prepared in the same manner as above excepting the omission of the low-temperature plasma treatment in the silane-containing atmosphere.

Each of these resin films was subjected to the cross-cut test to examine the adhesive bonding strength of the aluminum layer to the substrate surface. Thus, the aluminum layer was cut with a sharp knife on a 10 mm by 10 mm area across and down in a checkerboard-like manner to form 100 small square areas of each 1 mm by 1 mm dimensions and then an adhesive tape of a sufficient width was applied to the thus cross-cut area by pressing followed by peeling at a velocity of 1.0 cm/second to examine the number of squares of the aluminum coating layer left on the cross-cut area without being carried away by the adhesive tape. The results were that 98 of the 100 squares of the aluminum metallizing layer in the cross-cut area were left on the surface of the resin film prepared with the low-temperature plasma treatment in the silane-containing atmosphere while all of the squares were removed with the adhesive tape from the surface of the resin film provided with the aluminum metallizing without the low-temperature plasma treatment in the silane-containing atmosphere.

What is claimed is:

1. A method for the preparation of a shaped article of a flexible or semi-rigid polyvinyl chloride resin with a metallized surface which comprises the steps of:
   (a) subjecting the surface of a shaped article of a flexible or semi-rigid polyvinyl chloride resin to exposure to low temperature plasma generated in an atmosphere containing a vapor of an organosilicon compound under a pressure in the range from 0.001 to 10 Torr to deposit a polymerized layer of the organosilicon compound on the surface; and
   (b) metallizing the surface of the shaped article thus coated with the polymerized layer of the organosilicon compound in a dry process.

2. The method as claimed in claim 1 wherein the organosilicon compound is an organosilane represented by the general formula $R_aH_bSiX_{4-a-b}$, in which R is a substituted or unsubstituted monovalent hydrocarbon group, X is a halogen atom or an alkoxy group, the suffix a is a number of zero, 1, 2 or 3 and the suffix b is a number of zero or 1 with the proviso that a+b does not exceed 3, or a partial hydrolysis-condensation product thereof.

3. The method as claimed in claim 1 wherein the step (a) is preceded by a low temperature plasma treatment of the shaped article in an atmosphere of an inorganic gas.

4. The method as claimed in claim 3 wherein the inorganic gas is selected from the class consisting of helium, neon, argon, nitrogen, oxygen, air, nitrous oxide, nitrogen monoxide, nitric oxide, carbon monoxide, carbon dioxide, bromine cyanide, sulfur dioxide and hydrogen sulfide.

5. The method as claimed in claim 1 wherein the polymerized layer of the organosilicon compound has a thickness of at least 5 nm.

* * * * *